(12) United States Patent
Lee et al.

(10) Patent No.: US 8,054,002 B2
(45) Date of Patent: Nov. 8, 2011

(54) LIGHT EMITTING DEVICE WITH LIGHT EMITTING CELLS ARRAYED

(75) Inventors: Jae Ho Lee, Yongin-si (KR); Yeo Jin Yoon, Ansan-si (KR); Eu Jin Hwang, Jeonju-si (KR); Lacroix Yves, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 468 days.

(21) Appl. No.: 12/088,906

(22) PCT Filed: Dec. 5, 2006

(86) PCT No.: PCT/KR2006/005186
§ 371 (c)(1),
(2), (4) Date: Apr. 1, 2008

(87) PCT Pub. No.: WO2007/083885
PCT Pub. Date: Jul. 26, 2007

(65) Prior Publication Data
US 2008/0218098 A1    Sep. 11, 2008

(30) Foreign Application Priority Data
Dec. 16, 2005   (KR) .................. 10-2005-0124882

(51) Int. Cl.
*H05B 37/22* (2006.01)
(52) U.S. Cl. .............. 315/291; 315/185 R; 315/250
(58) Field of Classification Search .............. 315/246,
315/250, 291, 209 R, 185 R, 191, 192, 186
See application file for complete search history.

(56) References Cited

U.S. PATENT DOCUMENTS

| | | |
|---|---|---|
| 2005/0029529 A1 | 2/2005 | Yukimoto et al. |
| 2006/0138971 A1 | 6/2006 | Uang et al. |
| 2007/0080355 A1 | 4/2007 | Lin et al. |
| 2008/0136347 A1 | 6/2008 | Lin et al. |

FOREIGN PATENT DOCUMENTS

| | | |
|---|---|---|
| DE | 10103422 | 8/2002 |
| JP | 63-64059 | 4/1988 |
| JP | 03-41390 | 4/1991 |
| JP | 05-066718 | 3/1993 |
| JP | 05198843 | 8/1993 |
| JP | 05-347433 | 12/1993 |
| JP | 2004-284563 | 10/2004 |
| KR | 1020060071869 | 6/2006 |

OTHER PUBLICATIONS

Summany translation of DE10103422, Aug. 1, 2002, Kaifler.*
Summary translation of JP05198843, Aug. 6, 1993, Toshiba Lighting & Technol Corp.*
German Office Action dated Dec. 10, 2009.
Taiwan Preliminary Notice of the First Office Action dated Jul. 6, 2010.

* cited by examiner

*Primary Examiner* — David Hung Vu
(74) *Attorney, Agent, or Firm* — H.C. Park & Associates, PLC

(57) ABSTRACT

The present invention relates to a light emitting device. The light emitting device according to the present invention comprises a light emitting cell block having a plurality of light emitting cells; and a bridge rectifying circuit connected to input and output terminals of the light emitting cell block, wherein the bridge rectifying circuit includes a plurality of diodes between nodes. In manufacturing an AC light emitting device with a bridge rectifying circuit built therein, the present invention can provide a light emitting device capable of enhancing the reliability and luminance of the light emitting device by setting the size of diodes of the bridge rectifying circuit to be a certain size and controlling the number thereof.

11 Claims, 5 Drawing Sheets

(a)

(b)

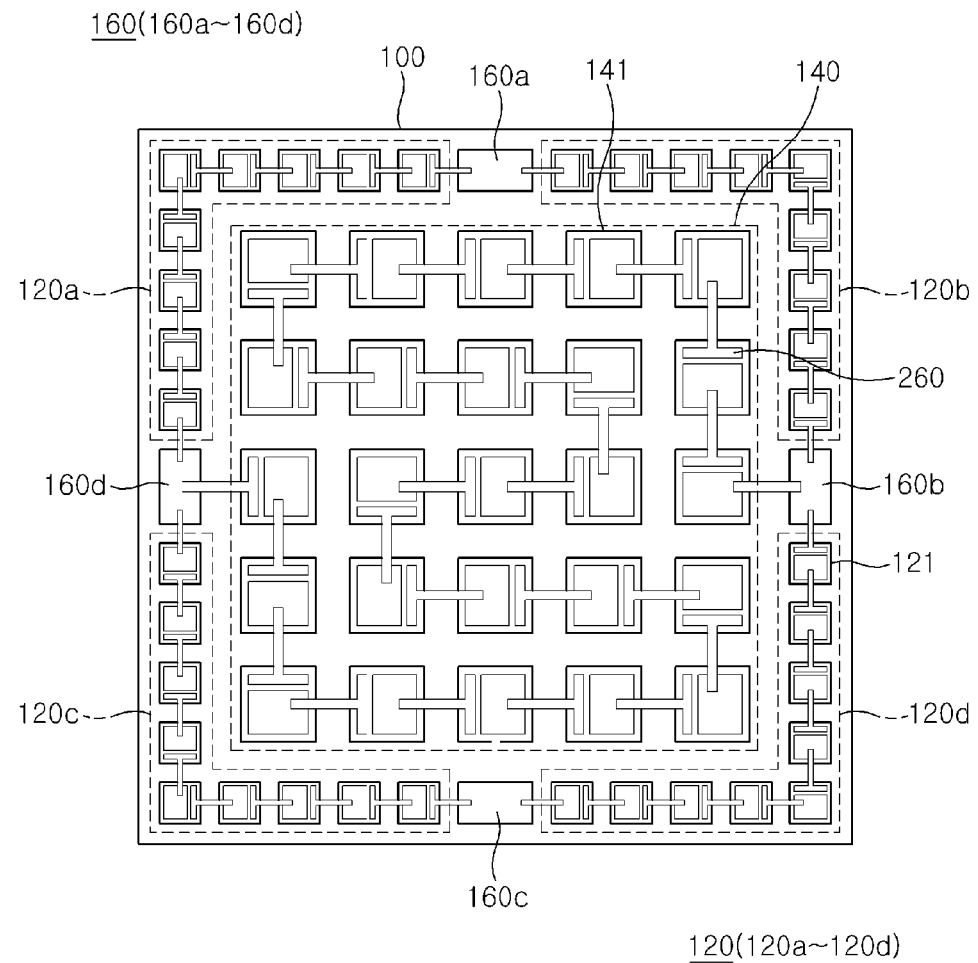
[Fig. 3]

[Fig. 4]
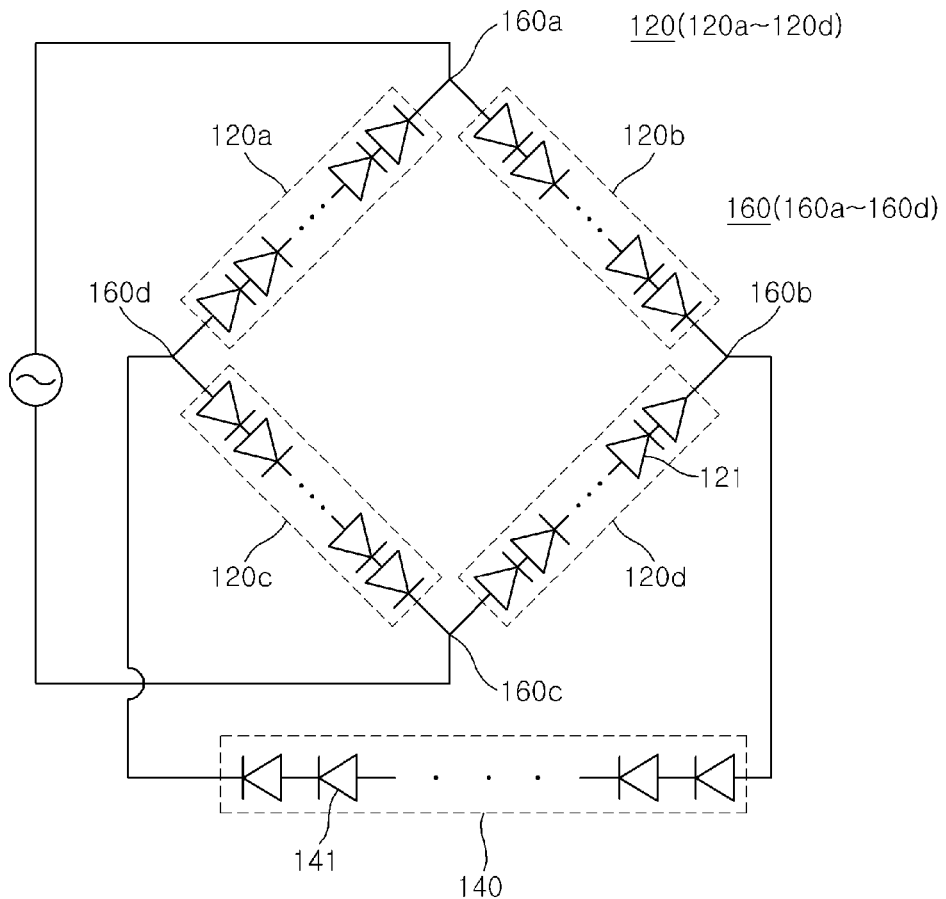
[Fig. 5]
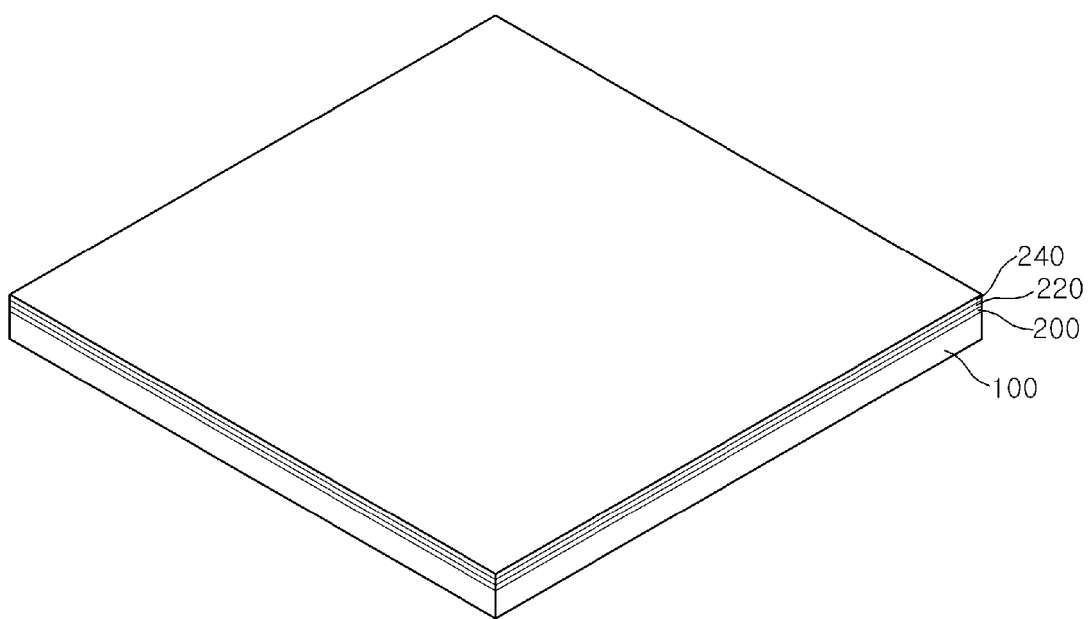

[Fig. 6]
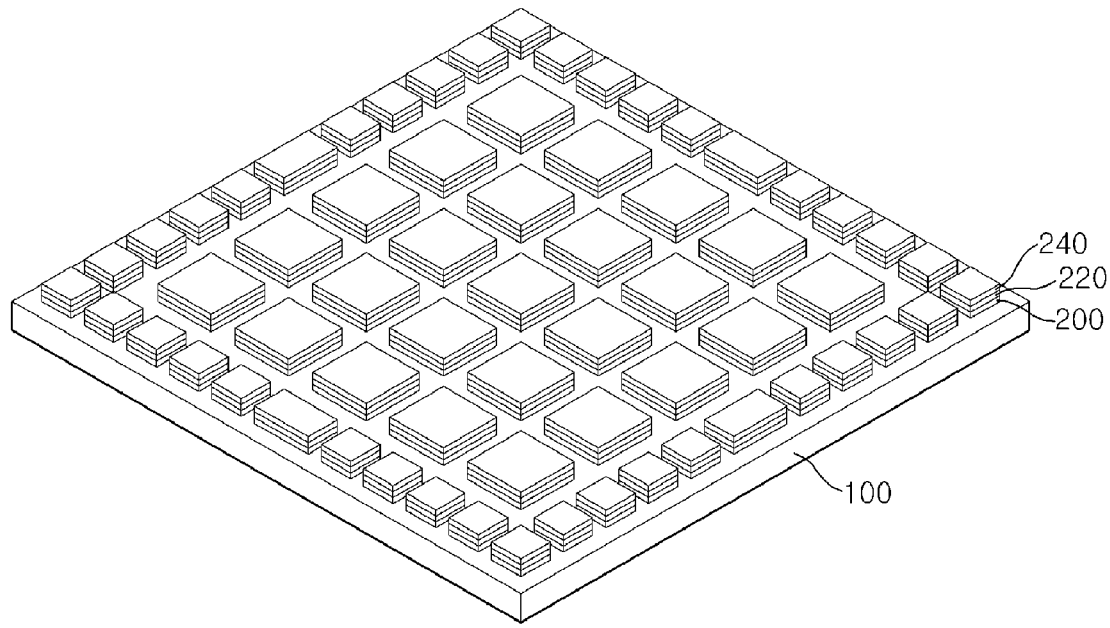
[Fig. 7]
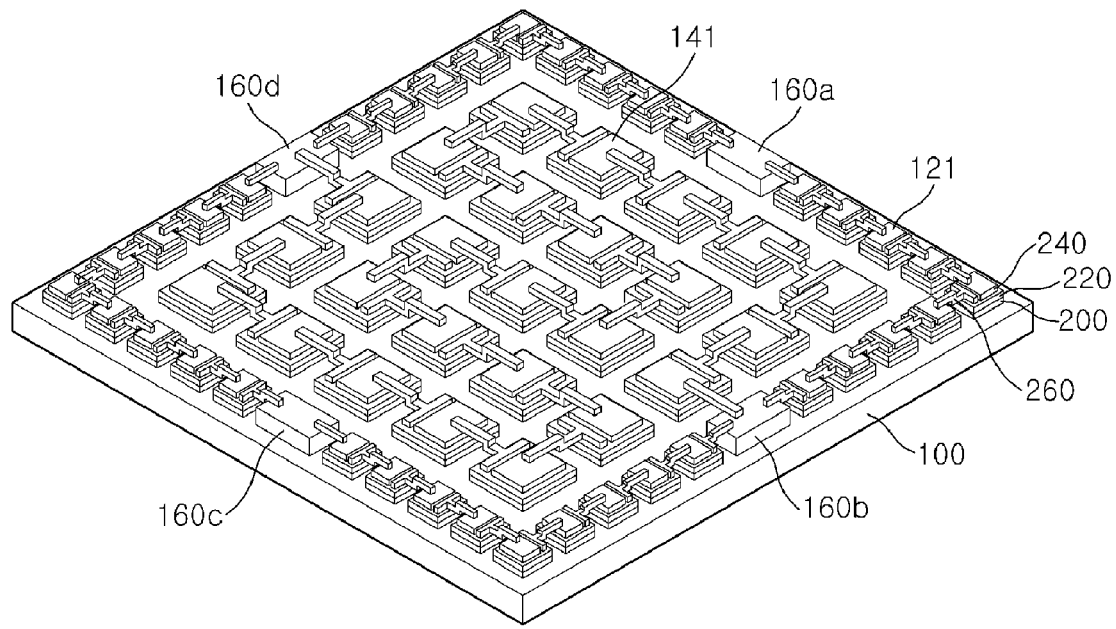

LIGHT EMITTING DEVICE WITH LIGHT EMITTING CELLS ARRAYED

CROSS REFERENCE RELATED APPLICATIONS

This application is the National Stage of International Application No. PCT/KR2006/005186, filed Dec. 5, 2006, and claims priority from and the benefit of Korean Patent Application No. 10-2005-0124882, filed on Dec. 16, 2005, which are both hereby incorporated by reference for all purposes as if fully set forth herein.

BACKGROUND OF THE INVENTION

1. Field of the Invention

The present invention relates to an AC light emitting device, and more particularly, to an AC light emitting device with a bridge rectifying circuit formed therein.

2. Discussion of the Background

As shown in FIG. 1, a conventional AC light emitting device comprises first and second light emitting cell blocks 1200a and 1200b, each of which has a plurality of light emitting cells connected in series on a substrate 1000. The first and second light emitting cell blocks 1200a and 1200b are arrayed in two lines from both electrodes 1600a and 1600b in different directions, i.e., connected in reverse parallel. As shown in FIG. 2, another conventional AC light emitting device comprises a bridge rectifying circuit having a light emitting cell block 1200 and four diodes 1400.

The conventional reverse parallel light emitting device as shown in FIG. 1 does not comprise a rectifying circuit. When an AC voltage is applied to the light emitting device, the first and second light emitting cell blocks 1200a and 1200b are alternately turned on/off. Since only any one of the first and second light emitting cell blocks 1200a and 1200b is turned on in such a conventional reverse parallel light emitting device, there is a problem in that the light emitting efficiency per unit area is low.

In the conventional light emitting device as shown in FIG. 2, the bridge rectifying circuit and the light emitting cell blocks 1200 are connected for enhancing the light emitting efficiency per unit area. However, a reverse voltage is applied to the diodes 1400 of the bridge rectifying circuit in such a conventional light emitting device. When an excess voltage is particularly applied thereto, there is a problem in that the conventional light emitting device is damaged by the excess voltage and thus is not operated.

SUMMARY OF THE INVENTION

The present invention is conceived to solve the aforementioned problems in the prior art. An object of the present invention is to provide a light emitting device having a bridge rectifying circuit, which can effectively enhance the reliability of operation and/or the luminance by controlling the size and/or number of diodes provided in the bridge rectifying circuit.

Another object of the present invention is to provide a light emitting device having a bridge rectifying circuit, which can enhance the reliability of operation and/or the luminance by setting the size of diodes and controlling the number of the diodes under the set size thereof.

A light emitting device according to the present invention comprises a light emitting cell block having a plurality of light emitting cells; and a bridge rectifying circuit connected to input and output terminals of the light emitting cell block, wherein the bridge rectifying circuit includes a plurality of diodes between nodes.

The number of the plurality of diodes is preferably 100 to 200% of that of the light emitting cells within the light emitting cell block, more preferably, 100 to 130% thereof.

The size of each diode is preferably 80% or less of that of the light emitting cell.

The light emitting cell block and the bridge rectifying circuit are preferably formed on the same substrate.

At least one light emitting diode is preferably included in the plurality of diodes.

Preferably, the plurality of diodes included in the bridge rectifying circuit are arrayed to surround the light emitting cell block. More preferably, at least two electrodes constituting each of the nodes are positioned within the array of the plurality of diodes.

Preferably, the entire shape of the light emitting device is a quadrangle.

According to the present invention, when manufacturing an AC light emitting device, the reliability of operation and the luminance of the AC light emitting device can be enhanced by controlling the size and number of diodes provided in a bridge rectifying circuit. Further, the luminance and the reliability of the light emitting device can be greatly enhanced by setting the size of diodes to be less than a certain size and controlling the number of diodes.

BRIEF DESCRIPTION OF THE DRAWINGS

FIG. 3 is a plan view of a light emitting device according to the present invention.

FIG. 4 is an equivalent circuit diagram of the light emitting device according to the present invention.

FIGS. 5 to 7 are views illustrating a method of manufacturing the light emitting device according to the present invention.

DETAILED DESCRIPTION OF THE ILLUSTRATED EMBODIMENTS

Figure 1:
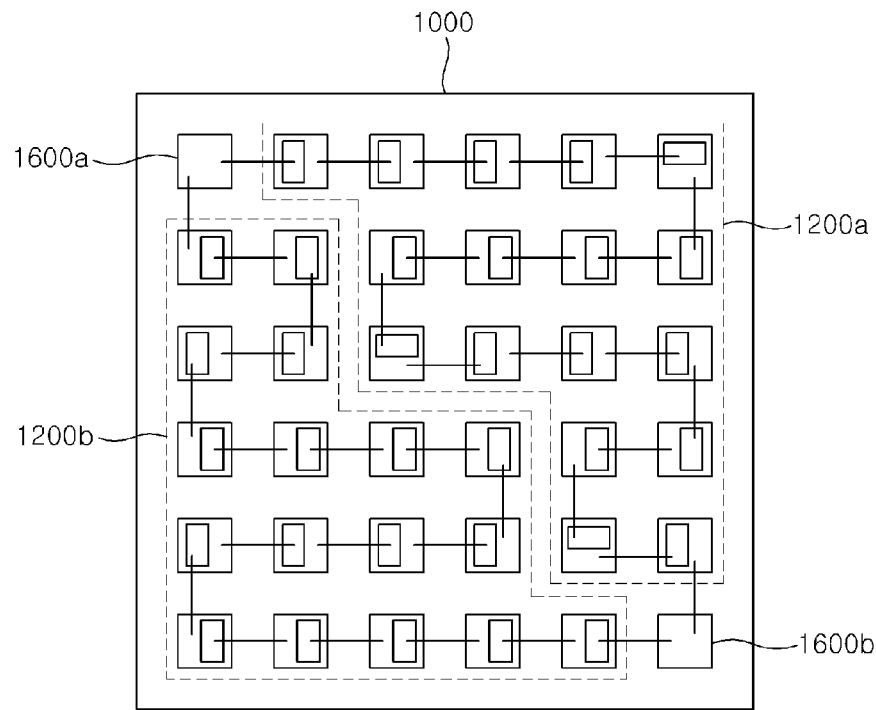
FIG. 1 is a conceptual view of a conventional reverse parallel light emitting device.
Figure 1:
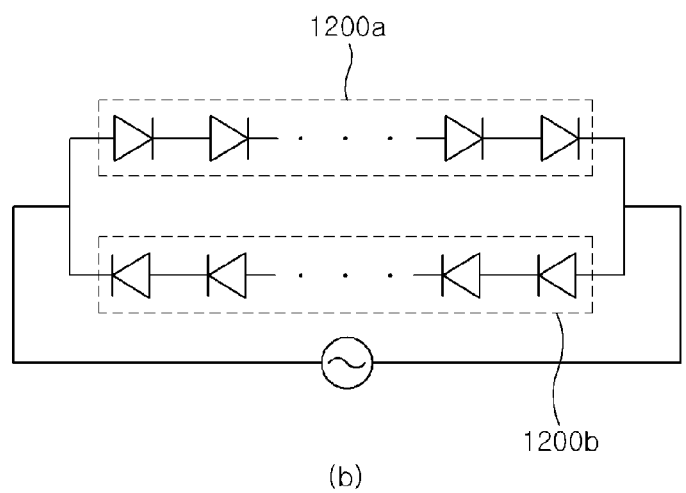
Figure 2:
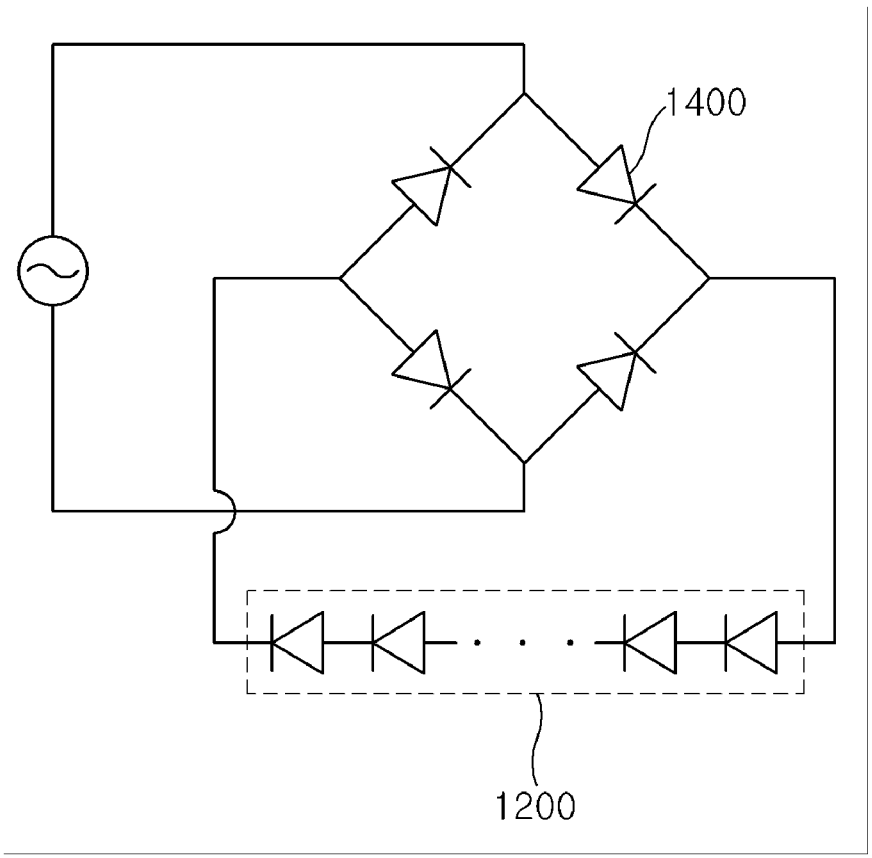
FIG. 2 is a conceptual view of a conventional light emitting device with a bridge rectifying circuit formed therein.

Hereinafter, a preferred embodiment of the present invention will be described in detail with reference to the accompanying drawings.

However, the present invention is not limited to the embodiment disclosed below but may be implemented into different forms. The present embodiment is provided only for illustrative purposes and for full understanding of the scope of the present invention by those skilled in the art. Throughout the drawings, like elements are designated by like reference numerals.

FIG. 3 is a plan view of a light emitting device according to the present invention, and FIG. 4 is an equivalent circuit diagram of FIG. 3.

As shown in FIG. 3, the light emitting device according to the present invention comprises a substrate 100, a light emitting cell block 140, a bridge rectifying circuit 120 and wires 260. The light emitting cell block 140 is provided on the substrate 100 and comprises a plurality of light emitting cells 141 connected in series. The bridge rectifying circuit 120 is provided on the substrate 100 and comprises a plurality of diodes 121 surrounding a peripheral portion of the light emitting cell block 140. The light emitting cell block 140 and the bridge rectifying circuit 120 are connected through the wires 260. At this time, the light emitting device may further comprise electrodes 160 for applying external power to the bridge rectifying circuit 120 and applying a normal application current rectified into a DC by the bridge rectifying circuit 120 to the light emitting cell block 140.

The light emitting cell block 140 comprises a plurality of light emitting cells 141 as a main light emitting source for emitting light when external power is applied thereto. Preferably, the light emitting cell block 140 is formed at an approximately central region of the substrate 100 in order to increase the luminance of the light emitting device. Further, the width and length of each light emitting cell 141 is about 50 to 500 µm.

The plurality of diodes 121 constitutes the bridge rectifying circuit 120 for rectifying AC power applied from the outside to have a normal application sine wave. Light emitting diodes as well as general diodes may be used as the plurality of diodes 121.

The plurality of diodes 121 are provided between respective nodes in the bridge rectifying circuit 120. That is, the bridge rectifying circuit 120 comprises first, second, third and fourth diode blocks 120a, 120b, 120c and 120d, each of which is a set of the diodes 121. At this time, since the bridge rectifying circuit 120 allows light to be emitted from two of the four diode blocks, it has a less influence on the luminance of the entire light emitting device than the light emitting cell block 140. Accordingly, the size of each diode 121 is set to be 80% or less of that of the light emitting cell 141, so that a large number of the light emitting cells 141 can be formed on the substrate 100 of which the size is limited, and the increase in number of the light emitting cells 141 enhances the luminance of the entire light emitting device. Further, since the bridge rectifying circuit 120 has an amount of light less than the light emitting cell block 140 but always emits the light from two of the four diode blocks, the luminance of the light emitting device can be enhanced.

If the number of the diodes 121 is larger than that of light emitting cells 141, for example, roughly 100 to 130% or so of the number of the light emitting cells 141, the breakdown of the diode 121 can be effectively prevented when a reverse bias voltage is applied to the light emitting device. At the same time, since the influence on the entire light emitting efficiency is relatively small although the size of each diode 121 is maintained to be relatively small, the proper light emitting efficiency of the light emitting device can be maintained. However, if the number of the diodes 121 is excessively larger than that of light emitting cells 141, the light emitting efficiency of the light emitting device may be reduced, and the power consumption may be increased by excessive increase of the driving voltage for the light emitting cell. Thus, it is preferred that the number of the diodes 121 do not exceed 200% of that of the light emitting cells 141.

The wires 260, which are used to connect the light emitting cells 141 and the diodes 121, are generally formed of Al or Au. At this time, the wires 260 may be formed through a bridge process, a step coverage process, a general wire bonding process or the like.

Hereinafter, the operation of the light emitting device so configured will be discussed with reference to FIG. 3 and FIG. 4 that is an equivalent circuit diagram of FIG. 3.

In the light emitting device including the bridge rectifying circuit 120 according to the present invention, if external AC power is applied to first and third electrodes 160a and 160c among the four electrodes 160, the second and third diode blocks 120b and 120c are in a turned-on state and the first and fourth diode blocks 120a and 120d are in a turned-off state when a forward voltage is applied. Thus, since the first diode block 120a is reverse biased with respect to a current applied to the first electrode 160a, the current does not flow through the first diode block but flows through the second diode block 120b. Further, since the fourth diode block 120d is reverse biased with respect to a current flowing through the second diode block 120b, the current flows through the light emitting cell block 140. Thereafter, the current applied to the light emitting cell block 140 flows out to the third diode block 120c.

When the voltage applied to the first and third electrodes 160a and 160c is a reverse voltage, the first and fourth diode blocks 120a and 120d are in a turned-on state and the second and third diode blocks 120b and 120c are in a turned-off state. Thus, the applied current does not flows through the third diode block 120c but flows through the fourth diode block 120d. Since the second diode block 120b is reverse biased with respect to the current flowing through the fourth diode block 120d, the current passes through the second electrode 160b and flows through the light emitting cell bock 140. Thereafter, the current flows out to the first diode block 120a.

That is, the second and third diode blocks 120b and 120c are turned on to prevent a reverse voltage from flowing therethrough when a forward voltage is applied, while the first and fourth diode blocks 120a and 120d are turned on to convert a reverse voltage into a forward voltage when the reverse voltage is applied. Accordingly, the externally applied AC voltage is full-wave rectified.

Hereinafter, a method of manufacturing a light emitting device having the aforementioned structure will be described with reference to the accompanying drawings.

A method of manufacturing the aforementioned light emitting device will be discussed below with reference to FIGS. 5 to 7. First, an undoped GaN layer (not shown), as a buffer layer is formed on the substrate 100. An N-type semiconductor layer 200, an active layer 220 and a P-type semiconductor layer 240 are sequentially crystal-grown on the buffer layer (FIG. 5). At this time, a transparent electrode layer (not shown) may be further formed on the P-type semiconductor layer 240. The respective layers are formed through various deposition methods for depositing the aforementioned materials.

Thereafter, the respective cells are electrically isolated from one another by performing a photo-etching process using a mask such that the substrate 100 is exposed (FIG. 6). That is, the substrate 100 is exposed by removing portions of the P-type semiconductor layer 240, the active layer 220 and the N-type semiconductor layer 200 through an etching process using the mask as an etching mask. At this time, the mask is formed of photoresist, and the light emitting cells 141, each of which has the width and length of 50 to 500 µm, are formed in the central region of the substrate 100. In addition, the diodes 121 surrounding the light emitting cells 141 are formed in the shape of a square or rectangle with the size of each diode 121 being 80% or less of that of the light emitting cell 141. At this time, the diodes 121 are formed such that the number thereof is larger than that of the light emitting cells 141, preferably, 100 to 200% of that of the light emitting cells 141. However, it is more preferred that the diodes be formed such that the number thereof is 120 to 130% of that of the light emitting cells 141 in consideration of the luminance of a light emitting device as against loss.

Meanwhile, a wet or dry etching process may be performed as the etching process. Preferably, a plasma assisted dry etching is performed in this embodiment.

After performing the process, the P-type semiconductor layer 240 and the active layer 220 are etched such that the N-type semiconductor layer 200 for each light emitting cell is exposed. Although the etching process may be performed using a single mask as described above, etching processes may be performed using different masks from each other. That is, a first etching process of exposing the substrate 100 may be performed using a first mask, and then, a second etching process of exposing predetermined regions of the P-type semiconductor layer 240 and the active layer 220 may be performed using a second mask so as to expose the N-type semiconductor layer 200.

After removing the mask, N-electrodes (not shown) are formed on the exposed N-type semiconductor layer 200, and P-electrodes (not shown) are formed on the P-type semiconductor layer 240.

Thereafter, the light emitting device shown in FIG. 3 is completed by connecting the N-electrodes on the N-type semiconductor layer 200 to the P-electrodes on the adjacent P-type semiconductor layer 240 through wires 260 using a predetermined bridge or step-cover process or the like (FIG. 7). At this time, in a case where transparent electrodes are formed on the P-type semiconductor layer 240 as the P-electrodes, the P-type semiconductor layer 240 is exposed by etching a portion of the transparent electrode through a photo process and a P-type bonding pad (not shown) may be formed.

Although it has been illustrated above that the light emitting cells 141 and the diodes 121 are formed on the same substrate 100, the present invention is not limited thereto but may be variously modified. For example, a light emitting device may be manufactured by mounting separately manufactured unit elements on a substrate. Further, although in the light emitting device according to the embodiment of the present invention, the light emitting cells 141 and the diodes 121 are formed on a quadrangular substrate and the entire shape of the light emitting device is a quadrangle, the present invention is not limited thereto but may be a rhombus. However, the light emitting device may be manufactured in various shapes according to use of light emitting devices and convenience of manufacture.

The right of the present invention is not limited to the embodiments described above but defined by the claims. Further, it will be understood by those skilled in the art that various changes and modifications can be made thereto within the scope of the invention defined by the claims.

The invention claimed is:

1. A light emitting device, comprising:
    a bridge block comprising first, second, third, and fourth blocks, each first, second, third, and fourth block comprising a plurality of light emitting cells arranged on a substrate; and
    a light emitting cell block positioned in the bridge block, the light emitting cell block comprising a plurality of serially connected light emitting cells arranged on the substrate,
    wherein a first electrode of a light emitting cell at a first end of the light emitting cell block is electrically connected to a second electrode of each light emitting cell at a first side end of the first block and third block in the bridge block, and a second electrode of a light emitting cell at a second end of the light emitting cell block is electrically connected to a first electrode of each light emitting cell at a first side end of the second block and fourth block in the bridge block,
    wherein the overall shape of the light emitting device is a quadrangle, and each of the first, second, third, and fourth bridge blocks is arranged on two sides of the substrate, and
    wherein the electrodes are respectively arranged at central portions of opposite sides of the substrate.

2. The light emitting device of claim 1, wherein a position where the first electrode of the light emitting cell at the first end of the light emitting cell block is electrically connected to the second electrode of each light emitting cells at the first side ends of the first block and third block in the bridge block and a position where the second electrode of the light emitting cell of the second end of the light emitting cell block is electrically connected to the first electrode of each light emitting cell of the first side ends of the second block and fourth block in the bridge block are arranged opposite to each other on the substrate.

3. The light emitting device of claim 2, further comprising a first additional electrode and a second additional electrode arranged on the substrate,
    wherein the first electrode of the light emitting cell at the first end of the light emitting cell block is electrically connected to the second electrode of each light emitting cell at the first side end of the first block and third block in the bridge block via the first additional electrode, and
    wherein the second electrode of the light emitting cell at the second end of the light emitting cell block is electrically connected to the first electrode of each light emitting cell at the first side end of the second block and fourth block in the bridge block via the second additional electrode.

4. The light emitting device of claim 1, further comprising two electrodes arranged on the substrate to supply external power to the light emitting device,
    wherein each light emitting cell at a second side end of the first block and the second block in the bridge block are electrically connected to one of the two electrodes, and
    wherein each light emitting cell at a second side end of the third block and the fourth block in the bridge block are electrically connected to the other of the two electrodes.

5. The light emitting device of claim 4, wherein the two electrodes are arranged opposite to each other on the substrate.

6. The light emitting device of claim 1, wherein the number of light emitting cells in the bridge block is 100 to 200% the number of light emitting cells in the light emitting cell block.

7. The light emitting device of claim 1, wherein at least one light emitting cell in the bridge block is at least 20% smaller than at least one light emitting cell in the light emitting cell block.

8. The light emitting device of claim 1, wherein the bridge block is arranged on an outermost peripheral portion of the substrate.

9. The light emitting device of claim 1, wherein the light emitting cells comprising the light emitting cell block are arranged in a first area,
    the light emitting cells comprising the bridge block are arranged in a second area, and
    the first area is entirely disposed within the second area.

10. The light emitting device of claim 9, wherein the first area is smaller than the second area.

11. A light emitting device, comprising:
    a bridge block comprising first, second, third, and fourth blocks, each first, second, third, and fourth block comprising a plurality of light emitting cells arranged on a substrate; and
    a light emitting cell block positioned in the bridge block, the light emitting cell block comprising a plurality of serially connected light emitting cells arranged on the substrate,
    wherein a first electrode of a light emitting cell at a first end of the light emitting cell block is electrically connected to a second electrode of each light emitting cell at a first side end of the first block and third block in the bridge block, and a second electrode of a light emitting cell at a second end of the light emitting cell block is electrically connected to a first electrode of each light emitting cell at a first side end of the second block and fourth block in the bridge block, wherein the overall shape of the light emitting device is a quadrangle comprising four sides, the first bridge block being arranged on first and second sides of the quadrangle, the second bridge block being arranged on the second side and a third side, the third bridge block being arranged on the third side and a fourth side, and the fourth bridge block being arranged on the fourth and first sides, and wherein the electrodes are respectively arranged at central portions of the four sides of the quadrangle.

\* \* \* \* \*